(12) United States Patent
Pudas

(10) Patent No.: US 12,065,730 B2
(45) Date of Patent: Aug. 20, 2024

(54) COATING OF FLUID-PERMEABLE MATERIALS

(71) Applicant: PICOSUN OY, Espoo (FI)

(72) Inventor: Marko Pudas, Espoo (FI)

(73) Assignee: PICOSUN OY, Espoo (FI)

( * ) Notice: Subject to any disclaimer, the term of this patent is extended or adjusted under 35 U.S.C. 154(b) by 0 days.

(21) Appl. No.: 16/894,160

(22) Filed: Jun. 5, 2020

(65) Prior Publication Data

US 2020/0385858 A1    Dec. 10, 2020

(30) Foreign Application Priority Data

Jun. 6, 2019 (FI) .................................. 20195479

(51) Int. Cl.
 *C23C 16/04*    (2006.01)
 *B05C 7/04*     (2006.01)
 (Continued)

(52) U.S. Cl.
 CPC .............. *C23C 16/045* (2013.01); *B05C 7/04* (2013.01); *B05C 9/04* (2013.01); *B05C 13/00* (2013.01);
 (Continued)

(58) Field of Classification Search
 CPC ............ C23C 16/045; C23C 16/45519; C23C 16/45544; C23C 16/18; C23C 16/34;
 (Continued)

(56) References Cited

U.S. PATENT DOCUMENTS 4,990,374 A * 2/1991 Keeley .................... C23C 16/04
                                                          118/715
5,221,354 A * 6/1993 Rigney ................... C23C 10/06
                                                          118/715

(Continued)

FOREIGN PATENT DOCUMENTS

JP      H06-57433 A      3/1994
JP      2005-306625 A   11/2005
(Continued)

OTHER PUBLICATIONS

FI Search Report, dated Feb. 7, 2020, from corresponding FI application No. 20195479.
(Continued)

*Primary Examiner* — Jeffrie R Lund
(74) *Attorney, Agent, or Firm* — NIXON & VANDERHYE

(57) ABSTRACT

Chemical deposition reactor assembly configured for formation of coatings on surfaces of fluid-permeable materials, such as porous materials, by chemical deposition is provided, the reactor assembly includes a reaction chamber configured to receive, at least in part, a fluid-permeable substrate with a target surface to be coated; at least one reactive fluid intake line configured to mediate a flow of reactive fluid into the reaction chamber, and an inert fluid delivery arrangement with at least one enclosed section configured to mediate a flow of inert fluid through the substrate towards its' target surface such, that at the surface the flow of inert fluid encounters the flow of reactive fluid, whereby a coating is formed at the target surface of the fluid-permeable substrate.

12 Claims, 10 Drawing Sheets

(51) Int. Cl.
- *B05C 9/04* (2006.01)
- *B05C 13/00* (2006.01)
- *C23C 16/18* (2006.01)
- *C23C 16/34* (2006.01)
- *C23C 16/40* (2006.01)
- *C23C 16/455* (2006.01)

(52) U.S. Cl.
CPC .............. *C23C 16/18* (2013.01); *C23C 16/34* (2013.01); *C23C 16/401* (2013.01); *C23C 16/403* (2013.01); *C23C 16/405* (2013.01); *C23C 16/45519* (2013.01); *C23C 16/45544* (2013.01); *C23C 16/45553* (2013.01); *C23C 16/45521* (2013.01)

(58) Field of Classification Search
CPC ... C23C 16/401; C23C 16/403; C23C 16/405; C23C 16/45553; C23C 16/45521; C23C 16/04; C23C 16/466; C23C 16/45555; C23C 16/48; C23C 16/4417; C23C 16/442; C23C 16/45514; C23C 16/406; C23C 16/45561; C23C 16/45597; C23C 16/455; B05C 13/00; B05C 9/04; B05C 7/04; C08F 10/00

See application file for complete search history.

(56) References Cited

U.S. PATENT DOCUMENTS

| | | | |
|---|---|---|---|
| 5,445,677 A * | 8/1995 | Kawata | C23C 16/04 118/724 |
| 5,695,831 A | 12/1997 | Miyazaki | |
| 5,853,485 A | 12/1998 | Rudolph et al. | |
| 5,900,297 A | 5/1999 | Rudolph et al. | |
| 6,057,022 A | 5/2000 | Rudolph et al. | |
| 6,082,950 A * | 7/2000 | Altwood | H01L 21/67778 414/217 |
| 6,332,926 B1 * | 12/2001 | Pfaendtner | C23C 16/042 118/721 |
| 6,365,013 B1 | 4/2002 | Beele | |
| 6,398,873 B1 * | 6/2002 | Yun | C23C 16/24 118/728 |
| 6,780,462 B2 | 8/2004 | Rudolph et al. | |
| 8,163,087 B2 * | 4/2012 | Faguet | C23C 16/5096 118/715 |
| 8,211,235 B2 | 7/2012 | Lindfors et al. | |
| 8,404,048 B2 * | 3/2013 | Ewert | C23C 14/541 118/724 |
| 8,425,979 B2 * | 4/2013 | Trzcinski | C23C 10/08 427/282 |
| 8,945,306 B2 * | 2/2015 | Tsuda | C23C 16/45544 156/345.33 |
| 8,986,450 B1 * | 3/2015 | Yanai | H01L 21/02186 438/758 |
| 9,206,512 B2 * | 12/2015 | Nguyen | C23C 16/45565 |
| 9,340,879 B2 * | 5/2016 | Yahata | C23C 16/4405 |
| 10,211,110 B1 * | 2/2019 | Kamakura | H01L 21/67017 |
| 10,622,196 B2 * | 4/2020 | Nagayama | H01J 37/32513 |
| 2003/0116278 A1 * | 6/2003 | Wheat | C23C 16/45508 156/345.33 |
| 2004/0020599 A1 * | 2/2004 | Tanaka | C23C 16/481 257/E21.17 |
| 2004/0144322 A1 | 7/2004 | Kuibira et al. | |
| 2006/0070573 A1 * | 4/2006 | Gartland | C23C 14/046 118/715 |
| 2007/0134919 A1 * | 6/2007 | Gunji | C23C 16/45548 257/E21.295 |
| 2008/0107808 A1 * | 5/2008 | Beele | C23C 16/4488 427/237 |
| 2009/0017205 A1 * | 1/2009 | Livings | C23C 10/06 427/237 |
| 2010/0147396 A1 * | 6/2010 | Yamagishi | H01L 21/67742 137/15.01 |
| 2010/0221583 A1 * | 9/2010 | Foad | G11B 5/82 427/127 |
| 2012/0220108 A1 | 8/2012 | Hara et al. | |
| 2013/0029043 A1 * | 1/2013 | Trzcinski | C23C 16/04 427/253 |
| 2013/0248014 A1 * | 9/2013 | Kobayashi | H01L 21/67109 137/334 |
| 2015/0075428 A1 * | 3/2015 | Bertrand | C23C 16/458 118/718 |
| 2015/0218693 A1 * | 8/2015 | Bertrand | C23C 16/045 118/718 |
| 2015/0345046 A1 * | 12/2015 | Muto | C30B 25/08 118/725 |
| 2016/0333475 A1 | 11/2016 | Gomm et al. | |
| 2017/0002452 A1 | 1/2017 | Bacos et al. | |
| 2017/0352565 A1 * | 12/2017 | Zhang | C23C 16/4586 |
| 2018/0171475 A1 | 6/2018 | Maes et al. | |
| 2019/0066998 A1 * | 2/2019 | Hawrylchak | C30B 25/02 |
| 2019/0067006 A1 * | 2/2019 | Hawrylchak | H01L 21/68785 |
| 2019/0249302 A1 | 8/2019 | Pudas | |
| 2020/0161176 A1 * | 5/2020 | Wong | H01L 21/67109 |
| 2020/0385858 A1 * | 12/2020 | Pudas | C23C 16/45514 |
| 2021/0351060 A1 * | 11/2021 | Ulavi | H01L 21/68771 |
| 2022/0308462 A1 * | 9/2022 | Berney | H01L 21/67103 |

FOREIGN PATENT DOCUMENTS

| | | |
|---|---|---|
| JP | 2016-506013 A | 2/2016 |
| JP | 2016-222530 A | 12/2016 |
| WO | 96/15285 A1 | 5/1996 |
| WO | 2009/013465 A1 | 1/2009 |
| WO | 2018/050954 A1 | 3/2018 |
| WO | 2019/046134 A1 | 3/2019 |

OTHER PUBLICATIONS

Ritala et al., "Rapid Coating of Through-Porous Substrates by Atomic Layer Deposition", Chem. Vap. Deposition, 2006, vol. 12, pp. 655-658.

Search Report and Written Opinion issued in Singapore Patent Application No. 10202005317W dated Dec. 23, 2020.

Extended European Search Report issued in European Patent Application No. 20178401.4 dated Oct. 19, 2020.

Office Action issue din Japanese Patent Application No. 2020-098635 dated Nov. 17, 2020 with English translation provided.

* cited by examiner

COATING OF FLUID-PERMEABLE MATERIALS

FIELD OF THE INVENTION

The present invention generally relates to thin-layer deposition methods and associated equipment. In particular, the present invention concerns a reactor assembly and a related method for formation of coatings on surfaces of fluid-permeable materials, such as porous materials, using chemical deposition techniques.

BACKGROUND

Chemical deposition methods, such as Chemical Vapor Deposition (CVD) and Atomic Layer Deposition (ALD), are extensively described in the art. ALD technology generally regarded as a subclass of CVD processes has proved an efficient tool for manufacturing high-quality conformal coatings on three-dimensional substrate structures.

ALD is based on alternating self-saturative surface reactions, wherein different reactants (precursors) provided as chemical compounds or elements in a nonreactive (inert) gaseous carrier are sequentially pulsed into a reaction space accommodating a substrate. Deposition of a reactant is followed by purging the substrate by inert gas. Conventional ALD cycle proceeds in two half-reactions (pulse first precursor—purge; pulse second precursor—purge), whereby a layer of material is formed in a self-limiting (self-saturating) manner, typically being 0.05-0.2 nm thick. The cycle is repeated as many times as required for obtaining a film with a predetermined thickness. Typical substrate exposure time for each precursor ranges within 0.01-1 seconds. Common precursors include metal oxides, elemental metals, metal nitrides and metal sulfides.

ALD offers significant benefits in view of capability of the method to generate coatings on essentially porous structures, impregnated with a variety of chemicals, as precursor gas(es) flow through the porous substrate and completely coat insides of the pores.

However, the same functionality constitutes a significant drawback when applied to formation of coating layers on the surfaces of essentially porous materials. In conventional ALD processes, precursor gas can absorb into certain porous substrates to a depth of about 1 mm in 1 second. In an event when formation of a nanometer-scale thick film is desired, removal of an excess of the reactant chemical (penetrated to a depth of about 1 mm) from said porous substrate is required. The latter is attained by rinsing (purging) the substrate by inert gas for a relatively long time, such as 1 min or longer after each pulse. Taking into account that (precursor) pulse duration is typically 0.1 s, and that purge duration is typically 1-10 s after each pulse (e.g. for non-porous substrates), rinsing time of 1 min or more per pulse significantly hinders the procedure. Moreover, at most instances it is impossible to control uniformity of the coating layer formed on the porous substrate. On the other hand, shortening of the pulse duration(s) does not enhance controllability over a depth of penetration of the reactant chemical into the porous substrate. Hence, formation of thin films on the surfaces of porous substrates by conventional ALD methods is hindered by lack of uniformity, poor film thickness control and, as a result, an insufficient level of reproducibility of the method.

In this regard, an update of atomic layer deposition technology is still desired, in view of addressing challenges associated with the application of ALD in manufacturing surface-coated porous materials.

SUMMARY OF THE INVENTION

An objective of the present invention is to solve or to at least alleviate each of the problems arising from the limitations and disadvantages of the related art. The objective is achieved by various embodiments of a reactor assembly configured for formation of coatings on surfaces of essentially fluid-permeable substrates by chemical deposition, related methods and uses thereof. Thereby, in one aspect of the invention a reactor assembly is provided.

In preferred embodiment, the reactor assembly is provided, comprising: a reaction chamber configured to receive, at least in part, a fluid-permeable substrate with a target surface to be coated; at least one reactive fluid intake line configured to mediate a flow of reactive fluid into the reaction chamber, and an inert fluid delivery arrangement with at least one enclosed section configured to mediate a flow of inert fluid through the fluid-permeable substrate towards its' target surface such, that at said surface the flow of inert fluid encounters the flow of reactive fluid, whereby a coating is formed at the target surface of said substrate.

In said reactor assembly, the fluid-permeable substrate is received into the reaction chamber in a manner that only the target surface of said substrate is exposed to the flow of reactive fluid.

In embodiments, the enclosed section is configured to adjoin the reaction chamber such, that fluid flow between said enclosed section and the reaction chamber occurs solely via the fluid-permeable substrate.

In embodiments, the fluid-permeable substrate is received, at least in part, inside the enclosed section.

In embodiments, the inert fluid delivery arrangement further comprises at least one inert fluid intake line.

In embodiments, the enclosed section is provided essentially outside the reaction chamber. In embodiments, the enclosure is provided in a reactor lid.

In other embodiments, the enclosed section is provided essentially inside the reaction chamber. In embodiments, the enclosed section is configured as a substrate holder for the fluid-permeable substrate.

In embodiments, the reactor assembly further comprises at least one heating element that adjoins to- or is integrated into the enclosed section and/or the inert fluid intake line(s).

In embodiments, the reactor assembly further comprises at least one inert fluid flow regulating device configured to alter the flow of inert fluid at predetermined points of time and to regulate the depth of penetration of reactive fluid into the fluid-permeable substrate at the target surface.

In embodiments, the reactor assembly further comprises at least one reactive fluid flow regulating device configured to control the flow of reactive fluid in the at least one reactive fluid intake line.

In some embodiments, the reactor assembly is configured as an atomic layer deposition (ALD) device. In some embodiments, the reactor assembly is configured as a photo-assisted ALD device. In further embodiments, the reactor assembly is configured as a Plasma Enhanced Atomic Layer Deposition (PEALD) device.

In another aspect, a method for coating surfaces of fluid-permeable substrates by chemical deposition is provided.

In embodiment, the method comprises: obtaining a chemical deposition reactor with a reaction chamber configured to receive, at least in part, a fluid-permeable substrate with a target surface to be coated, directing reactive fluid into the reaction chamber, and directing inert fluid through the fluid-permeable substrate towards the target surface such, that at said surface a flow of inert fluid encounters a flow of reactive fluid, whereby a coating is formed at the target surface of said fluid-permeable substrate.

In said method, inert fluid is directed through the fluid-permeable substrate via an inert fluid delivery arrangement with at least one enclosed section arranged separate from the reaction chamber such that fluid flow between the enclosed section and the reaction chamber occurs solely via the fluid-permeable substrate.

In embodiments, inert fluid is directed through the fluid-permeable substrate towards the target surface such, that penetration of reactive fluid inside said substrate is prevented.

In embodiments, the depth to which reactive fluid penetrates into the fluid-permeable substrate is regulated by altering the flow of inert fluid at predetermined points of time.

In some embodiments, the depth to which reactive fluid penetrates into the fluid-permeable substrate is regulated by discontinuing the flow of inert fluid at a time point when reactive fluid reaches the target surface of said substrate.

In some additional embodiments, at the time point when reactive fluid reaches the target surface of the fluid-permeable substrate, the flow of inert fluid is discontinued and reversed, whereby reactive fluid is allowed to penetrate into said substrate.

In embodiments, reactive fluid delivered into the reaction chamber comprises a predetermined precursor compound.

In embodiments, a number of predetermined precursors is delivered into the reaction chamber in sequential order. In the embodiments, delivery of each precursor is followed by rinsing the reaction chamber, wherein rinsing is implemented by directing inert fluid, into said reaction chamber, via the at least one reactive fluid intake line and/or via the at least one enclosed section.

In alternative embodiments, the coating is formed from a single precursor compound.

In embodiments, the fluid-permeable substrate is a porous substrate or a particulate substrate.

In embodiments, the fluid-permeable substrate is selected from the group consisting of porous metal, porous ceramics and porous polymer.

In embodiments, the coating layer formed at the target surface of the fluid-permeable substrate comprises a catalytic compound.

In further aspect, a coated item of fluid-permeable material with a surface comprising a coating layer formed by the method according to the previous aspect is provided.

In embodiments, said coated item comprises the fluid-permeable material established by a particulate material. In embodiments, said coated item comprises the fluid-permeable material established by a porous material selected from the group consisting of porous metal, porous ceramics and porous polymer. In the embodiments, the coating layer formed at the surface of said coated item comprises a catalytic compound.

In embodiments, the coated item is configured as a body made of porous material comprising at least one opening or a pathway therein.

In still further aspect, use of the reactor assembly according to some previous aspect is provided for coating sensor devices, in particular, gas sensor devices.

In still further aspect, use of the reactor assembly according to some previous aspect is provided for manufacturing solid-state porous catalysts.

The utility of the present invention arises from a variety of reasons depending on each particular embodiment thereof. The invention provides for depositing coatings in the form of thin films on the surfaces of porous materials with varying degree of porosity (e.g. 1-99%) in relatively fast and effortless manner. Indeed, the invention allows conducting chemical deposition reactions on the surfaces of porous substrates with speed same or at least comparable to that for deposition on non-porous substrates. Expedited manufacturing rates allows for improved cost-effectiveness of the entire production chain.

The invention thus allows for significantly reducing, in terms of time, the step of rinsing the reaction space by inert fluids between pulsing precursors into said reaction space.

The invention further provides for fine-tuning the measure, indicative of an extent to which precursors are allowed to penetrate into the porous substrate, whereby depth resolution (indicative of thickness of the coating) can be controlled with high precision. This is particularly important for applications, which require layer deposition on porous substrates with submicron resolution, such as micro- and nano-electronics and/or medical applications, e.g. implants.

Moreover, the reactor installation disclosed herein is extremely flexible in terms of accommodating substrates of varying shapes and sizes. Thus, the reactor can be configured to accommodate single or multiple substrates of relatively simple shapes, such as sheets, slabs, discs, and the like, or substrate(s) having essentially complex 3D shapes. In majority of cases coated items establish ready-to-use items for a variety of applications, such as provision of supports for solid-state catalysts and/or provision of sensing devices.

In the present disclosure, materials with a layer thickness below 1 micrometer (μm) are referred to as "thin films".

The expression "reactive fluid" is indicative in the present disclosure of a fluidic flow comprising at least one chemical compound, hereafter, a precursor, in an inert carrier. This expression is further applicable to a fluidic flow configured to convey at least two different precursors in sequential order, whereby each precursor is introduced into a reaction chamber one at a time.

In the context of present disclosure, the term ALD comprises all applicable ALD based techniques and any equivalent or closely related technologies, such as, for example the following ALD sub-types: plasma-assisted ALD, PEALD (Plasma Enhanced Atomic Layer Deposition) and photon-enhanced Atomic Layer Deposition (known also as photo-ALD or flash enhanced ALD).

The expression "a number of" refers in the present disclosure to any positive integer starting from one (1), e.g. to one, two, or three. The expression "a plurality of" refers herein to any positive integer starting from two (2), e.g. to two, three, or four.

DETAILED DESCRIPTION OF THE DRAWINGS

Figure 1A:
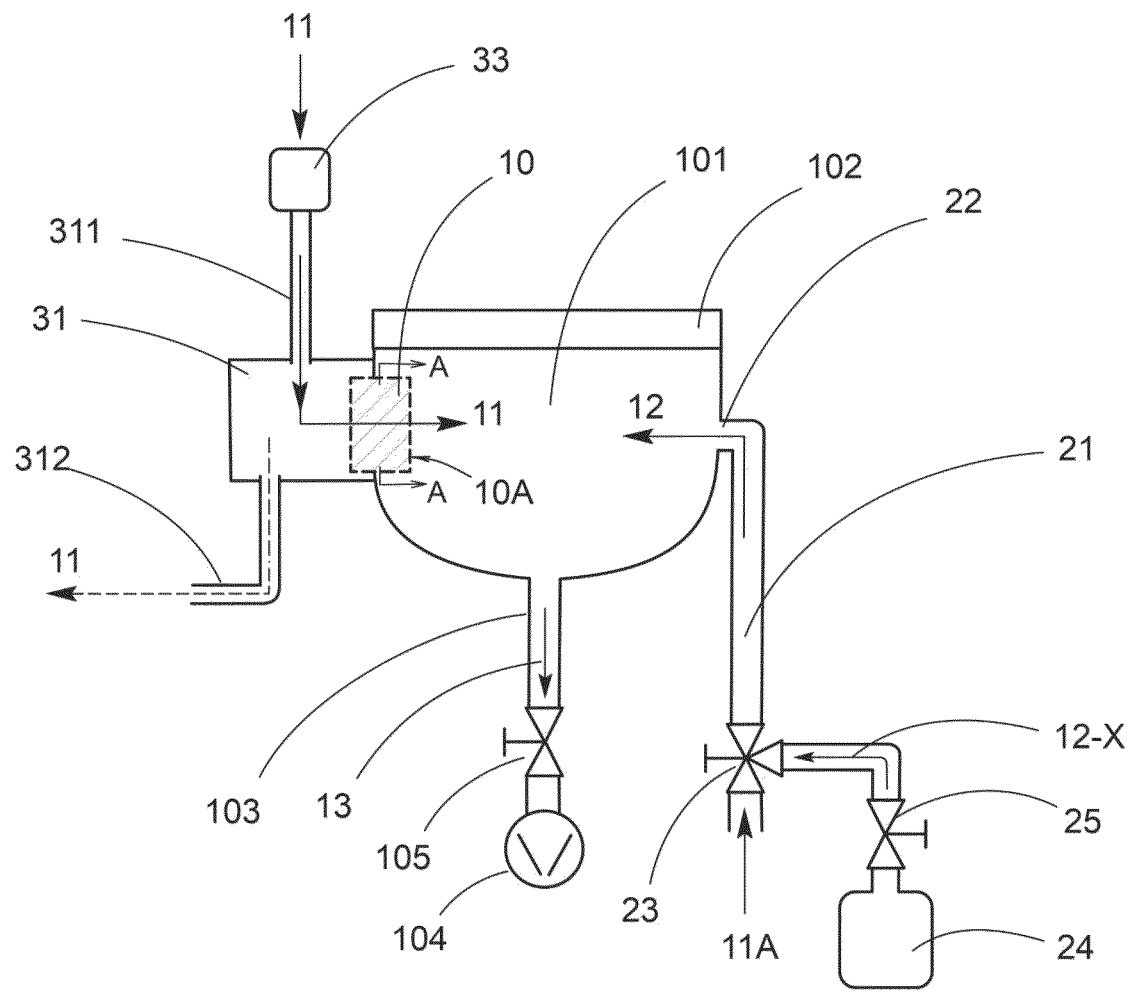
FIGS. 1A, 1B, 2, 4A and 4B schematically illustrate various embodiments of a chemical deposition reactor assembly according to one aspect of the present invention.

Detailed embodiments of the present invention are disclosed herein with the reference to accompanying drawings. The same reference characters are used throughout the drawings to refer to same members. Following citations are used for the members:
- 100—a reactor assembly;
- 101—a reaction chamber;
- 102—a lid;
- 103—a central evacuation line/a pump fore-line;
- 104—a pump;
- 105—a valve (exhaust);
- 10, 10A—a porous substrate and its' target surface to be coated, accordingly;
- 11—inert fluid;
- 11A—inert carrier fluid for precursor chemical(s);
- 12—reactive fluid;
- 12-X, -12-1, 12-2—precursors;
- 13—an exhaust flow;
- 21—a reactive fluid intake line;
- 22—an inlet for receiving reactive fluid into the reaction chamber;
- 23—a reactive fluid flow regulating device;
- 24—a precursor source;
- 25—a precursor flow regulating device;
- 31—an enclosed section within an inert fluid delivery arrangement;
- 31A—an aperture in the enclosed section 31, according to an embodiment
- 31-1, 31-2—auxiliary enclosed sections, according to an embodiment;
- 311—an inert fluid intake line;
- 312—an inert fluid escape line (optional);
- 313, 313A—a heating element;
- 314—a feed-through retainer;
- 32—a source of electromagnetic radiation;
- 33—an inert fluid flow regulating device;
- 34—a conveying device;
- 35—a loading device;
- 36—an unloading device;
- 110—an external chamber;
- 121—a coating.

Figure 7:
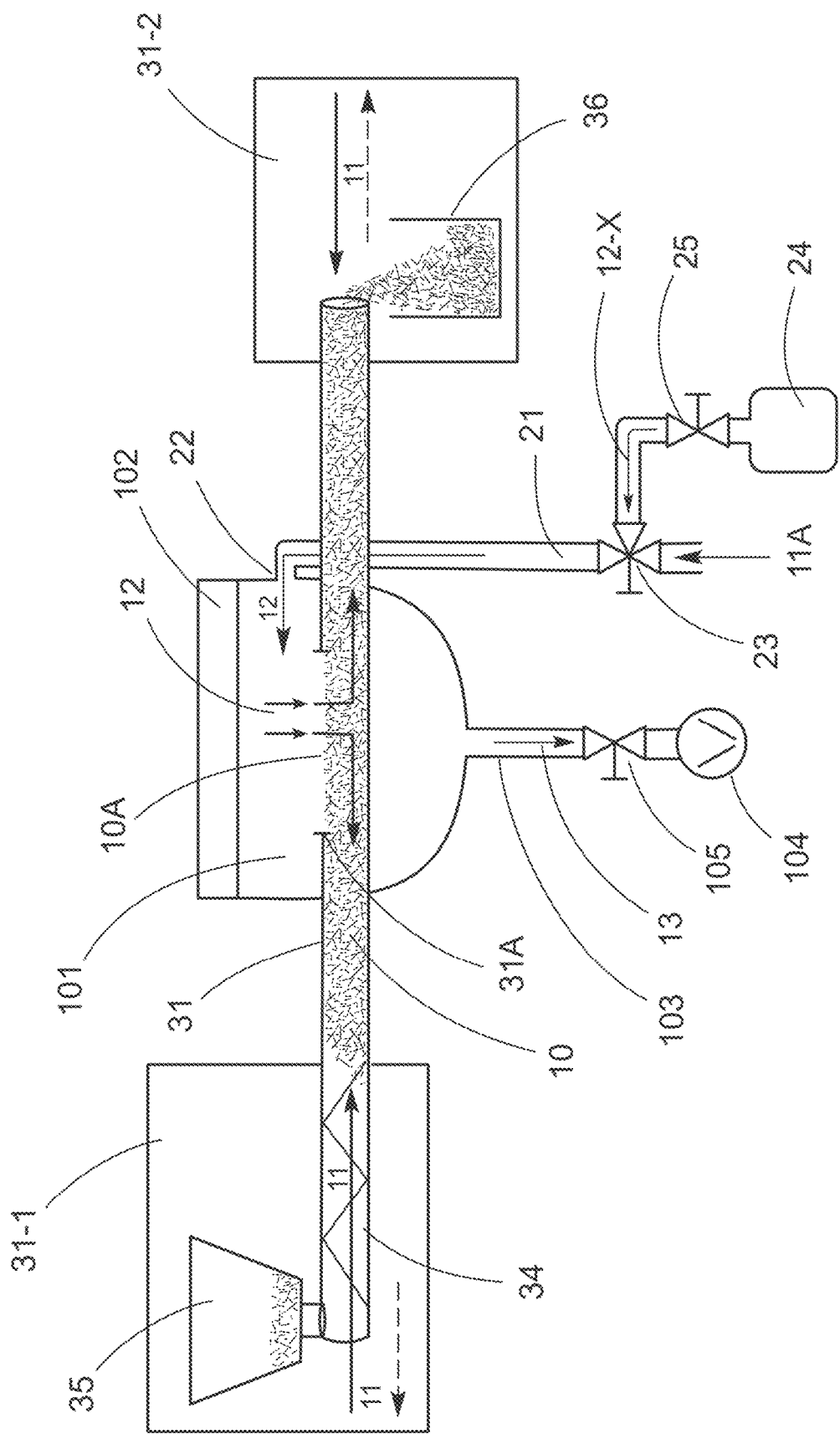
FIG. 7 schematically illustrates a chemical deposition reactor assembly according to the embodiment.

FIGS. 1, 2, 4 and 7 illustrate, at 100, a reactor assembly (hereafter, "a reactor") in accordance with various embodiments. In all configurations the reactor 100 is implemented such, as to allow for formation of coatings on surfaces of essentially fluid-permeable substrates by chemical deposition. The essentially fluid-permeable substrates are preferably the substrates made of porous materials (FIGS. 1, 2, 4) or, alternatively, the substrates made of particulate materials (FIG. 7).

The reactor is preferably configured to exploit principles of vapor-deposition based techniques. In terms of an overall implementation, the reactor 100 may be based on an ALD installation described in the U.S. Pat. No. 8,211,235 (Lindfors), for example, or on the installation trademarked as Picosun R-200 Advanced ALD system available from Picosun Oy, Finland. Nevertheless, the features underlying a concept of the present invention can be incorporated into any other chemical deposition reactor embodied as an ALD, MLD (Molecular Layer Deposition) or CVD device, for example.

Reference is made to FIG. 1A illustrating the reactor 100 according to one embodiment. The reactor 100 comprises a reaction chamber 101. A reaction space (deposition space) is established by an interior of said reaction chamber 101.

In some instances, the reaction chamber 101 can be configured as an open-top vessel sealed with a lid 102 (FIGS. 1-3, 6). The reaction chamber shown on FIGS. 1-3 and 6 thus has a showerhead type flow. The reactor 100 has an essentially circular layout when viewed from above.

In some instances, the reaction chamber can be configured as a vessel loadable from side or from the bottom (not shown). In such configurations the lid is configured as a hatch disposed laterally (within a sidewall) or at the bottom of the reactor vessel. Such type of reaction chambers may have a crossflow blown from the side, for example.

The reactor 100 further comprises a number of appliances configured to mediate a flow of reactive fluid 12 into the reaction chamber 101. Mentioned appliances are provided as a number of intake lines (hereafter, feedlines) 21 and associated switching and/or regulating devices 23, such as valves, as disclosed further below.

FIG. 1A is illustrative of the embodiment, in which precursor fluid 12 is delivered inside the reaction chamber 101 by means of at least one feedline 21 via a corresponding inlet 22.

In some instances, it is preferred that the reactor comprises two, three or more feedlines 21 and a corresponding number of inlets 22 (not shown). By such an arrangement, a number of different precursors can be directed into the reaction chamber via separate feedlines and inlets, accordingly. The reactor 100 can comprise as many feedlines and associated inlets as considered feasible in terms of the deposition process and the apparatus design.

The reactor can be further configured without the feedline 21 (i.e. having the feedline 21 omitted completely). In such an event, the valve 23 is integrated into a sidewall of the vessel that forms the reaction chamber 101 or into the lid 102.

In some configurations, the reactor may comprise a manifold feedline with a common inlet 22 or a number of common inlets and a distributing pipework connectable to a variety of precursor sources and an inert gas supply or supplies (not shown).

Precursor(s) are delivered into the feedline 21 in a fluidic form. Reactive fluid 12 flowing through the feedline 21 is preferably a gaseous substance comprising a predetermined precursor chemical 12-X carried by an inert carrier 11A. Precursor(s) are supplied into the feedline 21 from a supply source or sources 24 configured as containers, cartridges or a piping system, for example. Each source 24 preferably contains a predetermined precursor 12-X provided as a chemical compound or an element. Each source 24 is equipped with at least one valve 25, provided as a manual closing valve, for example. A variety of precursor chemicals required for deposition reaction(s), such as ALD reaction(s), can be directed into the reaction space via a single feedline 21.

In some instances, precursor(s) 12-X are provided in a gaseous form, such as ammonia gas ($NH_3$). In some other instances, precursor(s) are provided in liquid or solid forms and vaporized prior to being admixed to the inert carrier.

Inert carrier 11A is a fluid, preferably gas, such as nitrogen ($N_2$), argon (Ar) or any other suitable gaseous medium that possesses essentially zero reactivity towards the precursors (reactants) and the reaction products. Inert carrier gas 11A is supplied from a separate source or sources (not shown).

By the way of an example, widespread in creating microelectromechanical systems (MEMS) ALD process for depositing aluminum oxide using trimethylaluminum (first precursor) and water (second precursor) would employ two chemicals sequentially supplied into the reaction chamber from two sources 24 via the same feedline 21 or two different feedlines.

Manufacturing complex multilayer structures (so called stacks), wherein each layer is produced in a separate ALD cycle and/or wherein said layers differ from one another in terms of composition, may employ three or more different precursors and supply sources, accordingly.

In some instances, a mixture of compounds, such as a predetermined precursor in a solvent, for example, can be supplied from the same source 24.

Precursor(s) 12-X and the inert carrier 11A, supplied from different sources, enter the feedline 21 via a multi-port valve 23. The valve 23 is configured as a three-port valve, for example, with an automated control system and optionally a manual backup control. In preferred configurations the valve 23 is a three-way ALD-valve. ALD valves are configured to maintain a steady flow of inert carrier fluid 11A into the reaction chamber and to introduce fluidic precursor(s) 12-X into said carrier at predetermined points of time. The ALD valve can be configured to inject the precursor 12-X into the (continuously) flowing carrier. Additionally or alternatively, other control means, such as mass flow controller(s), for example (not shown), can be provided upstream said valve 23 to interrupt the flow of carrier fluid 11A for a time period the precursor 12-X being injected into the feedline 21. In either situation, injection of a precursor is performed in brief pulses (0.01-100 s, typically 0.1 s).

In configurations when the reactor comprises more than one feedline 21, it is preferred that each said feedline is equipped with the ALD valve 23.

The feedline or feedlines 21 and the associated valve or valves 23 together establish a reactive fluid delivery arrangement. Said arrangement may further comprise a number of auxiliary components, such as precursor- and inert carrier intake lines disposed upstream the valve 23, additional fluid flow regulating appliances, such as valve(s) 25, for example, and control devices (not shown).

In some configurations (not shown) the feedline 21 may be arranged such, as to direct reactive fluid 12 into the reaction chamber 101 via the lid 102. The lid 102 may optionally comprise a flange or flanges along and/or around its edge.

The reactor 100 further comprises an evacuation line 103 for discharging an exhaust flow 13, such as excess carrier, precursor and reaction products, out of the reaction chamber 101. The evacuation line 103 constitutes a fore-line for an evacuation pump unit 104 and it may comprise, in some configurations, a closing valve 105, preferably upstream the pump unit 104. It is preferred that withdrawal of fluidic substance from the reaction chamber is implemented in an uninterrupted manner, whereby the pump unit 104, preferably configured as a vacuum pump, removes fluidic substance from the reaction chamber continuously during the entire deposition process.

It is preferred that the reaction chamber 101 is kept under vacuum during operation, loading and unloading, whereupon pressure therein is typically maintained at a level of 100 Pa (1 mbar) or preferably less. Still, in some configurations, pressure in the reaction chamber is set-up at the same level as the ambient pressure.

Figure 1B:
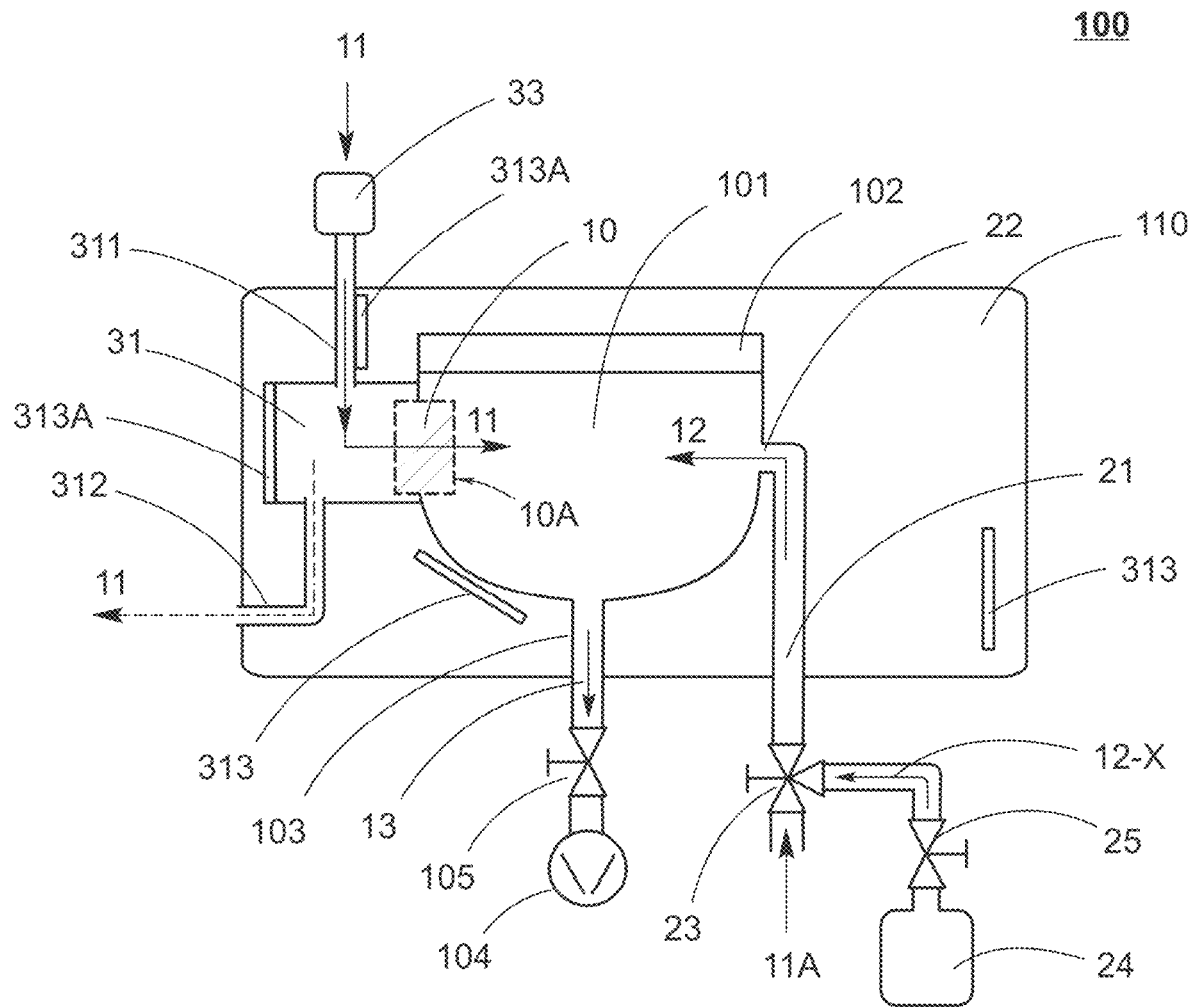

In configuration shown on FIG. 1B the reactor 100 additionally includes an external housing 110, in which the reaction chamber 101 is accommodated. In some instances, an intermediate space established by an interior of said external housing 110 is maintained under vacuum and referred to as a vacuum chamber. It is preferred that pressure in said intermediate space is maintained at a level of at least 1 kPa (10 mbar) to establish a pressure difference between the interior of the reaction chamber 101 (typically, less than 100 Pa) and the interior of the external housing 110.

Said intermediate space can further accommodate a number of heating elements 313, 313A. A number of heating elements 313 can be placed such, as to adjoin the reaction chamber 101. Additionally or alternatively, a number of heating elements can be integrated into a wall or walls of the vessel that forms the reaction chamber 101. In further, additional or alternative configurations, heating of the reaction space can be implemented by directing pre-heated fluid, such as gas, thereinto, via the feedline 21, for example. In such an event, a number of heating elements can be arranged such, as to adjoin or to encompass said feedline 21 or to incorporate into a pipe forming said feedline (not shown).

The external housing 110 can be further included into configurations shown on FIGS. 2, 4A, 4B and 7, in the same manner as shown on FIG. 1B.

With reference back to FIG. 1A, the fluid-permeable substrate 10, configured as a porous material and having a target surface 10A intended for deposition of a coating layer thereon is further received, in its entirety or at least in part, into the reaction chamber 101. For the purposes of the invention it is preferred that the substrate 10 is received into the reaction chamber in a manner that no other surface(s) of said substrate is/are exposed to the flow of reactive fluid except the target surface 10A. Thus, position of the substrate 10 in the reactor assembly is such that it is solely the target surface 10A of said porous material, which is exposed to the flow of reactive fluid 12.

The expression "a target surface" is hereby indicative of an exterior surface of the porous material to be coated. With reference to FIGS. 1-6, by the "porous material" we refer to a finite item consisting of or comprising of said porous material. In a latter case, the porous material can be configured as an item comprising a layer of porous material thereon or being encapsulated in said porous material. In embodiments, the porous material 10 is provided as essentially solid porous substrate or substrates for chemical deposition reaction(s).

A variety of porous materials can be utilized as porous substrate(s) including, but not limited to metals, ceramics, polymers, composites and semiconductor materials (e.g. silicon). Cellular solids, such as metal foams and ceramic foams, can further be exploited.

With reference to FIG. 7, the fluid-permeable substrate can be further established by an essentially flowable particulate substrate, including, but not limited to powder substrates and/or fibrous substrates. In fact, said particulate substrate can be considered as a modification of porous substrate having pores formed by air gaps established between particles, fibers or any other related particulate matter.

The invention sets no restrictions on the nature of the fluid-permeable substrate, such as the porous substrate or the particulate substrate; nevertheless, for the one skilled in the art it is clear that selection of the substrate depends on ability of potential substrate materials to withstand reaction conditions, such as temperature and pressure, and on compatibility of the predetermined precursor chemicals with said substrate material and with one another to form a predesigned coating.

As mentioned hereinabove, in conventional chemical deposition systems, such as ALD systems, precursor chemical(s) diffuse into some porous substrates placed into the reaction chamber, at possible rates within a range between 0.001-1000 mm/s, such as at a rate of about 1 mm per second, for example, and deposit onto insides of the pores.

The reactor 100 is configured to effectively prevent diffusion of precursor chemical(s), which arrive with the reactive fluid 12 onto the fluid-permeable substrate 10, inside said substrate. Precursor(s) do not penetrate inside the substrate 10, but instead reside(s) on the surface of said substrate exposed to the reactive fluid flow (viz. the target surface 10A), whereby a coating is formed at said target surface.

The coating is formed upon establishing and/or adjusting a counter-flow by directing inert fluid 11 through the fluid-permeable substrate 10 in a direction of the reaction chamber 101. While reactive fluid 12 containing a precursor 12-X arrives at the target surface 10A via the reaction chamber 101, the flow of inert fluid 11 arrives at said target surface 10A through the fluid-permeable material 10. At the surface 10A the flow of inert fluid 11 encounters the flow of reactive fluid 12 and prevents precursor(s) from penetrating into the substrate. This results in formation of a coating 121 and is described in greater detail hereinbelow, with reference to FIGS. 5 and 6.

The flow of inert fluid 11 into the reaction chamber 101 is mediated by an inert fluid delivery arrangement. Said arrangement comprises an essentially hollow, enclosed space, hereafter, an enclosed section 31, having a predetermined volume (V). The enclosed section 31 is essentially isolated from the reaction chamber 101 such, that fluid communication (fluid flow) between the section 31 and the reaction chamber 101 occurs solely via the fluid-permeable material 10. Inert fluid 11 is allowed to flow through an interior of the enclosed section 31 in an unhindered manner.

It is preferred that the fluid-permeable substrate 10 is received, at least in part, inside the enclosed section 31.

In some configurations, the inert fluid delivery arrangement further comprises at least one inert fluid intake line 311.

In some configurations, the inert fluid delivery arrangement comprises the enclosed section 31 established by said at least one inert fluid intake line 311. Exemplary configuration of such kind is shown on FIG. 3A.

Figure 3A:
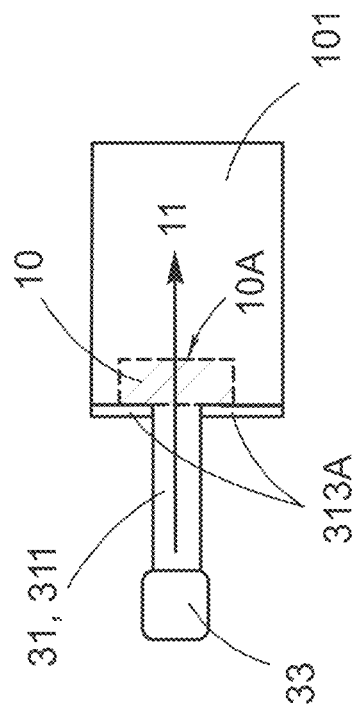
FIGS. 3A-3D schematically illustrate provision of certain elements within the reactor assembly, according to the embodiments.

Propagation of fluids through essentially solid (porous) or particulate materials is accompanied by changes in fluid dynamics characteristics of said fluids, such as velocity, flow geometry, boundary conditions, and the like. Thus, change in fluid dynamics occurs upon propagation of inert fluid 11, flowing from the (essentially hollow) volume, such as via the interior of the enclosed section 31, through the porous material 10. Change in fluid propagation characteristics allows for provision of the fluid intake volume configured as an essentially tubular member with a porous "inlet" 10 at one end (FIG. 3A).

To ensure sufficient flow volume especially through essentially large pieces (e.g. having surfaces to be coated exceeding 1 cm$^2$) of fluid-permeable materials, in particular, porous materials at uniform flow rates, it is advantageous that the enclosed section or space 31 is configured to adjoin the reaction chamber 101. In such instances, the enclosed section 31 can be viewed as an expansion of the inert fluid intake line 311. The section 31 is thus configured to adjoin the reaction chamber 101 such, that fluid flow between said section 31 and the reaction chamber 101 occurs solely via the porous material 10 and an unhindered flow of inert fluid is enabled throughout the entire enclosed space 31.

The inert fluid intake line or lines 311 can be implemented in the same manner as the feedline(s) 21, i.e. provided as a pipe or a pipework connectable to a related fluid source preferably via appropriate distributing device(s), such as valve(s) (as described hereinbelow).

Figure 2:
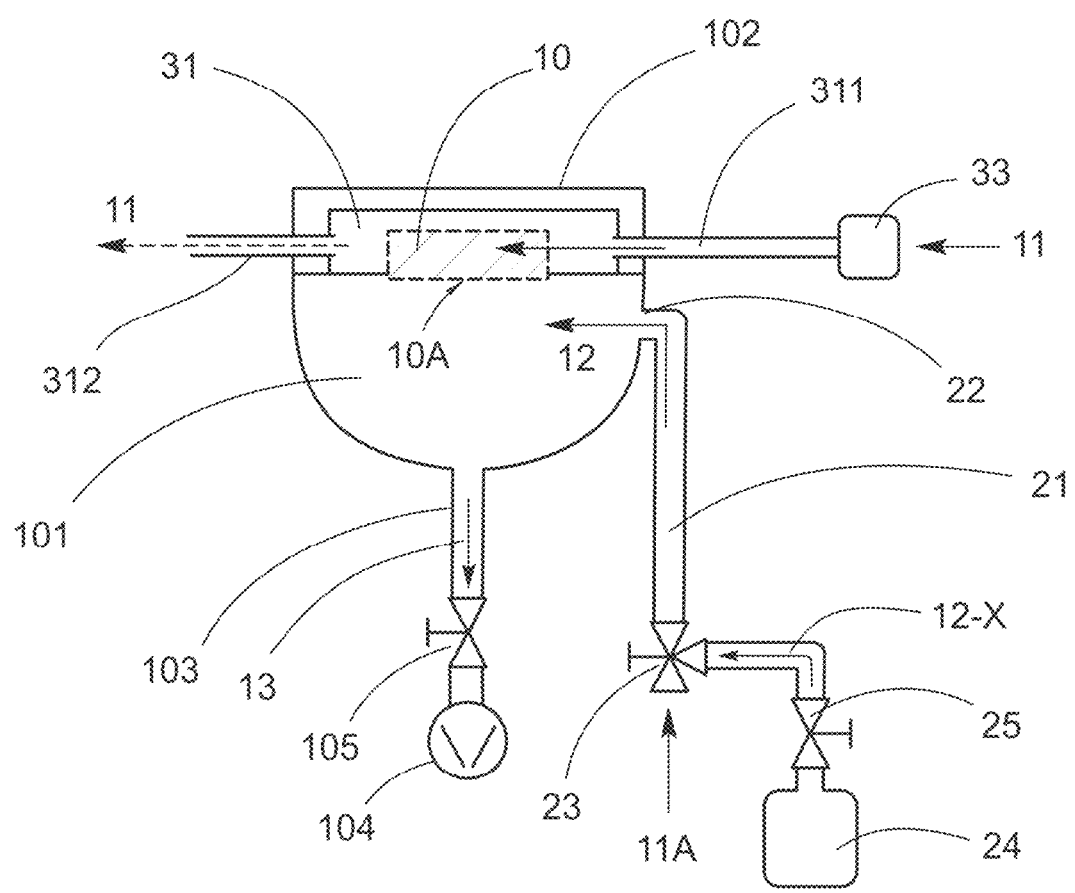

In some embodiments, the enclosed section 31 is provided essentially outside the reaction chamber 101 (FIGS. 1A, 1B, 2).

Figure 1C:
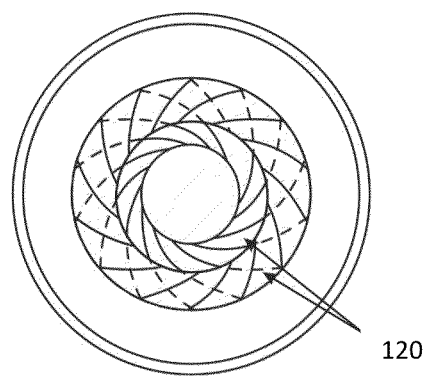
FIG. 1C is a cross-sectional view of a circumference-adjusting system in the form of a two-layer bladed iris diagram taken along the line A-A shown in FIG. 1A.

FIG. 1A shows a reactor layout, in which the enclosed space 31 adjoins the reaction chamber essentially via a sidewall of the vessel that forms said reaction chamber. In said sidewall an aperture is arranged to accommodate the porous substrate 10 (not shown). The aperture can be optionally adjustable. For example, the aperture may include a motorized circumference-adjusting system configured in a manner of two-layer rotary bladed iris diaphragm 120 (FIG. 1C). FIG. 1C thus shows a circumference-adjusting system configured as a two-layer rotary bladed iris diaphragm 120 as a cross-sectional view along the line A-A taken through the aperture in the sidewall of the reaction chamber shown in FIG. 1A. The porous substrate 10 thus forms a fluid-permeable inlet for the inert fluid 11 flowing from the volume defined by the enclosed section 31 to the reaction space.

In some configurations, the enclosed section 31 can be further provided as an elongated, essentially tubular member comprising a number of inert fluid intake lines 311. Such an arrangement allows for connecting two or more reactors to a common inert fluid intake source (not shown).

In some instances, inert fluids designated by reference numerals 11, 11A may be supplied from the same source or a number of interconnected sources (not shown).

FIG. 2 illustrates another embodiment of the reactor 100, in which the enclosed section 31 is provided in the lid 102. The fluid-permeable inlet is established by the porous substrate 10 to allow the flow of inert fluid 11 from the enclosed space 31 (disposed in the lid 102), via the intake line 311, to the reaction space. Other configurations include provision of the enclosed space 31 in the form of the intake line 311 (in a manner shown on FIG. 3A) or provision of the space 31 comprising a number of intake lines 311.

In similar manner, the enclosed space 31 can be provided in the lid configured as a hatch in the sidewall- or in the bottom of the reactor (not shown).

In the embodiments described above the porous substrate 10 is at least partly incorporated inside the enclosed space 31, provided that the surface 10A of said substrate to be coated is exposed to reactive fluid 12 arriving at said surface from the reaction chamber 101.

Figure 3B:
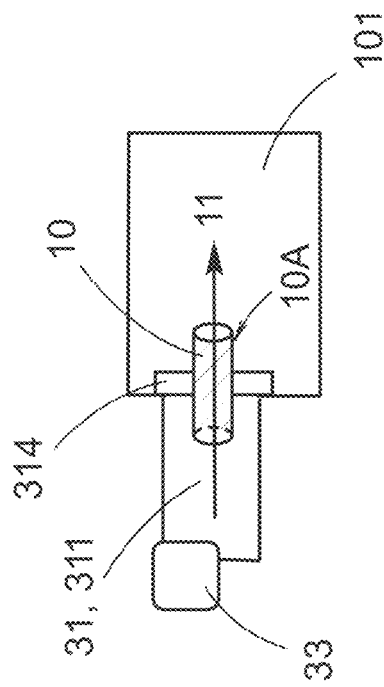
Figure 3C:
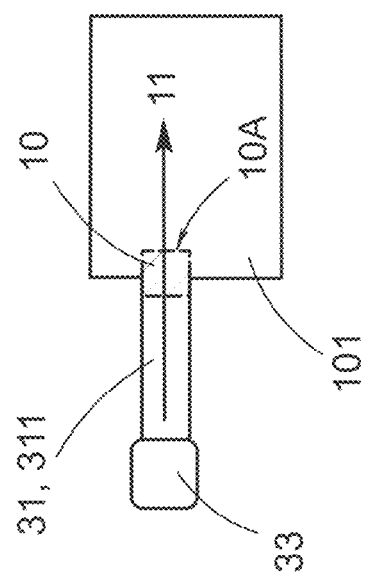

FIGS. 3B and 3C illustrate configurations alternative to those shown on FIGS. 1A,B and 2, accordingly. Hereby, the fluid-permeable substrate 10 is disposed entirely in the reaction chamber 101, as being attached to an inner surface of the reaction vessel (FIG. 3B) or the lid (FIG. 3C). A number of retainers or connectors, including, but not limited to pins, pegs, screw connectors, adhesives and/or support materials, such as meshes or nets (the latter provided on the side of the reaction chamber) can be adapted to hold the substrate 10 in place.

Configurations shown on FIGS. 1A, 1B and 2 may include an optional inert fluid escape line 312 configured to withdraw inert fluid 11 from the volume defined by the enclosed space 31. The inert fluid escape line 312 can be further connected, via a separate route or routes (not shown), to the pump 104 or to an additional pump or any other appropriate appliance configured for evacuation of exhaust flow. The enclosed space 31, as shown on FIGS. 1A, 1B and 2 is thus configured to mediate the flow of inert fluid 11 therethrough by means of the additional inert fluid escape line 312. Whether provision of the escape line 312 is omitted (FIGS. 4A, 4B), inert fluid 11 that enters the reaction chamber 101 via the fluid-permeable substrate 10 is discharged from the reaction space via the central evacuation line 103. Alternatively, a single fluid connection, provided as the intake line 311, for example, can be adopted to transfer fluids in both directions, as controlled by an appropriate regulating appliance (e.g. an appliance described further below).

Figure 4A:
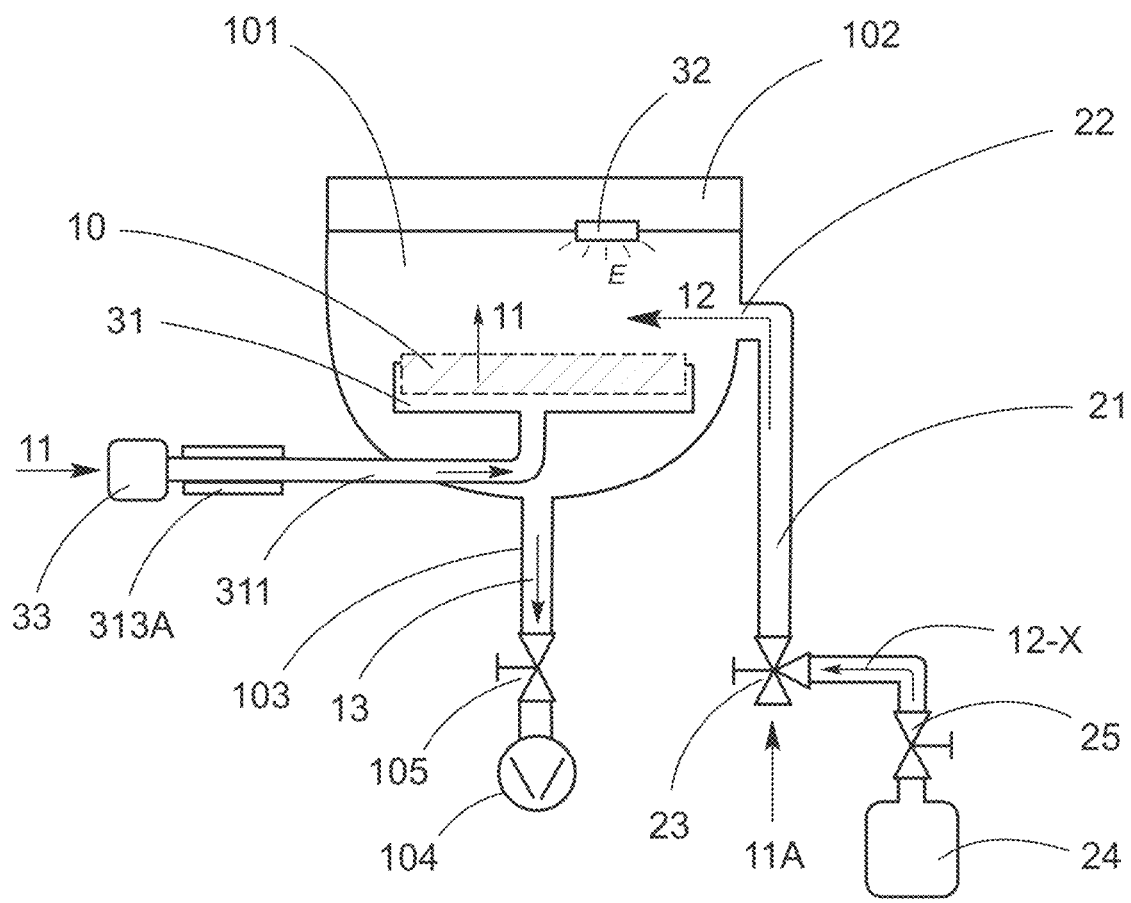
Figure 4B:
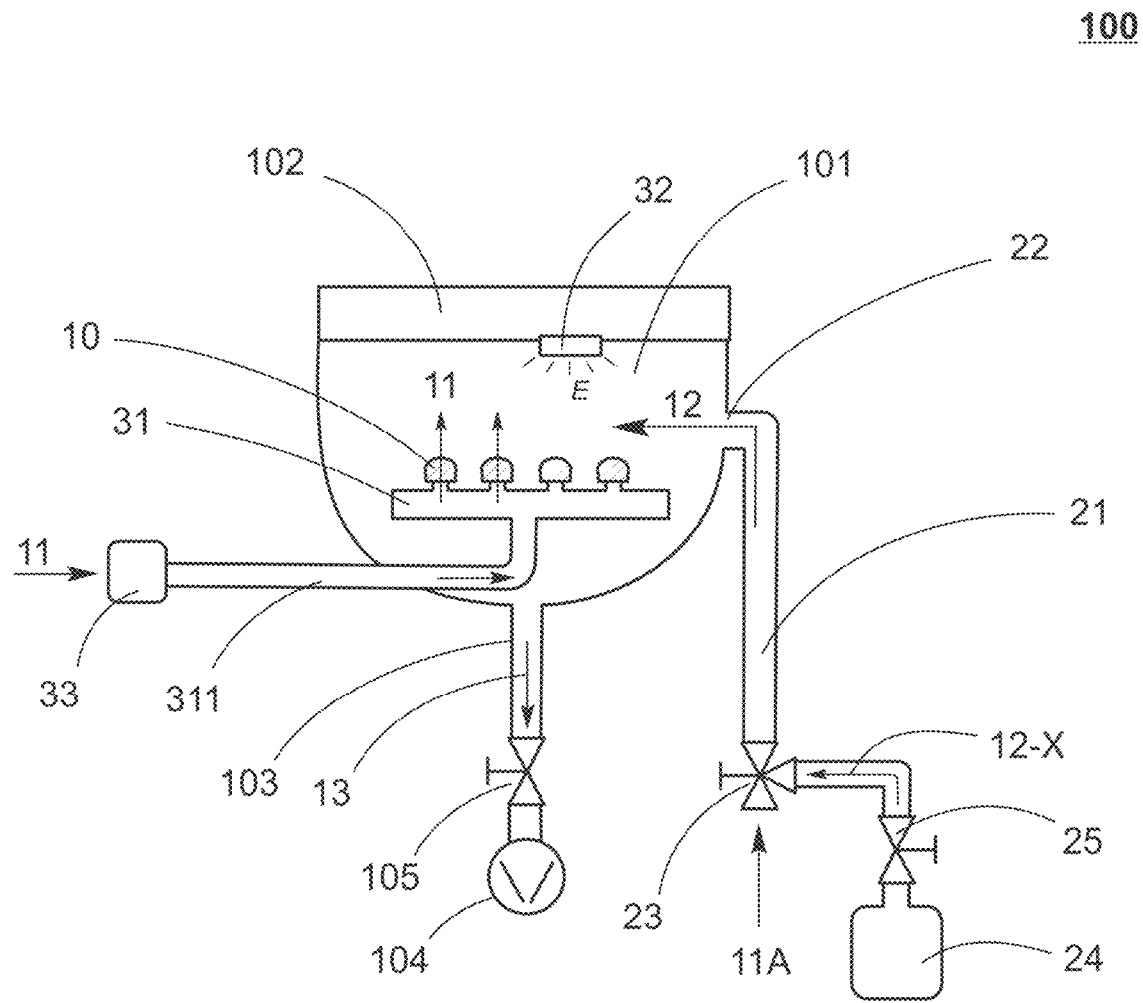

Reference is made to FIGS. 4A and 4B that illustrate the reactor 100 according to further embodiments. The reactor shown on FIGS. 4A, 4B comprises the enclosed section 31 essentially inside the reaction chamber 101. FIG. 4A shows a layout for coating an individual substrate 10, whereas FIG. 4B shows a layout for coating a plurality of individual substrates.

The inert fluid intake arrangement shown on FIGS. 4A, 4B, comprises the enclosed section 31 and the associated inert fluid intake line 311. The enclosed section 31 is hereby configured as a substrate holder for substrate(s) made of the fluid-permeable material. A single substrate or multiple (at least two) substrates can be positioned into the reaction chamber 101 at a time. Inert fluid 11 is received, via the intake line 311, into the enclosed section 31 configured as the substrate holder, therefrom inert fluid 11 is further directed, through the substrate or substrates made of porous material 10, into the reaction chamber. The substrate(s) 10 can be placed and/or secured on the substrate holder (FIGS. 4A, 4B). Alternatively, the substrate(s) 10 can be at least partly incorporated into said substrate holder (FIG. 4A). Configuration depicted on FIG. 4A allows for accommodating an individual substrate, whose ultimate size measure is limited only by dimensions of the reaction chamber. The reactor of FIG. 4A advantageously provides for coating the individual substrates shaped as sheets, slabs, discs, and the like; said substrates having essentially smooth or patterned surfaces.

FIG. 4B depicts an exemplary configuration for the enclosed section 31 configured as the substrate holder and comprising a number of protrusions capped with essentially cup-shaped (concave from inside) substrates made of porous material 10. At capped ends the protrusions are open to allow unrestricted flow of inert fluid through the porous material. Precursor(s) are deposited along an entire surface of the porous substrate exposed to the flow of reactive fluid 12 in the reactive space. Therefore, configuration depicted on FIG. 4B allows for coating distinct (separate from one another) porous substrates of any shape, including complex, three-dimensional structures. Mentioned structures can be secured on the substrate holder 31 by means of the aforesaid protrusions or by any other appropriate holding appliances provided that unhindered flow of inert fluid 11 is allowed through the porous portions.

Each substrate, as depicted on FIG. 4B can be further provided as a body made of porous material and comprising at least one opening or a pathway (blunt-ended or a path-through) therein. Thus, configuration shown on FIG. 4B allows for applying deposition coatings on surfaces, such as inner- and outer surfaces, of essentially tubular members made of porous material. In some instances, the porous substrate 10 is thus provided as at least one essentially tubular member or a pipe-like structure (flow-through or blunt end), with a crosscut selected from a variety of geometric shapes (circle, semicircle, ellipse, rectangle, pentagon, and the like). Deposition coating can be applied, at least partly, onto an outer surface of said structure and, additionally or alternatively, onto an inner surface of said structure.

Configuration shown on FIG. 4B allows for applying deposition coatings on surfaces of sensing/detecting devices made of porous materials, such as a variety of gas sensors (e.g. cup-shaped gas sensors).

Configuration shown on FIG. 4B allows for applying deposition coatings on surfaces of various medical devices and/or parts thereof. In some configurations, the medical device is provided as an essentially tubular member made of fluid-permeable material. In some particular configurations, the medical device is provided as a catheter, a stent or an endoscopic device.

The reactor assembly disclosed hereby enables applying deposition coatings onto the substrates mentioned above, such as medical devices or parts thereof, with high precision, by targeting chemical reaction(s) onto the surfaces of said devices to a required/desired depth, by limiting the distance (depth resolution) to which reactive chemicals flow into the substrate material.

Figure 3D:
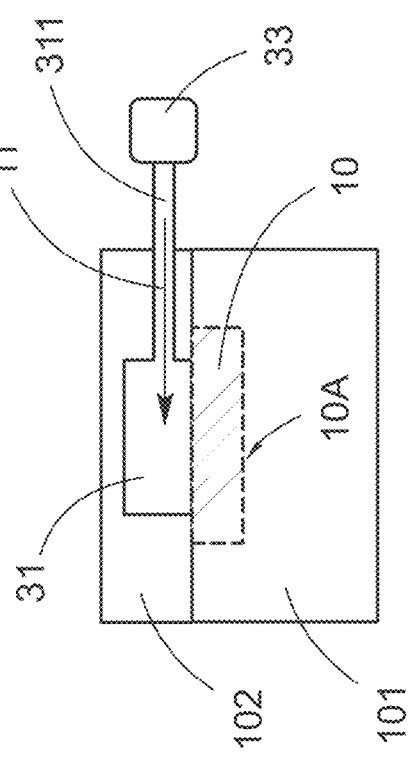

A configuration shown on FIG. 3D addresses partial exposure of said devices or parts thereof to the flow of reactive fluid, whereby provision of deposition coating can be limited to predetermined areas of said devices, such as tips (e.g. endoscope head).

Partial exposure can be attained by placing the substrates 10 or parts thereof into the reaction chamber by means of a suitable substrate retainer 314, such as a feed-through substrate retainer. Configuration shown on FIG. 3D allows for preserving the substrates, at least partly, outside the reach of elevated temperatures typical for the reaction space 101. Distance measure, to which reactive chemical is allowed to flow into an interior of the essentially tubular substrate 10 (away from the reaction space 101) can be controlled by the inert fluid flow regulating device 33 via reversing flow of inert fluid 11, for example.

The substrate holder depicted on FIGS. 4A and 4B can be configured detachable from the intake line(s) 311 and replaceable.

A number of heating elements 313A can be further provided in conjunction with the enclosed section 31 (e.g. in the intermediate space 110 and/or incorporated into the wall(s) of an enclosure forming the section 31). FIGS. 1B, 3B and 4A illustrate, in a non-limiting manner, disposition of the heating elements 313A within the reactor.

Additionally or alternatively, pre-heated fluid, such as gas, can be directed into the reaction chamber 101 via said enclosed section 31 and/or the intake line(s) 311. In embodiments, at least one heating element 313A (FIG. 1B, 4A) adjoins to, encompasses, or is integrated into wall(s) of the intake line 311, whereupon inert fluid 11 directed via said line 311 and the enclosed section 31 into the reaction chamber has higher temperatures in comparison to fluid(s) in the reaction chamber 101.

In preferred embodiments, the reactor assembly 100 further comprises at least one inert fluid flow regulating device 33 configured to alter the flow of inert fluid 11 at predetermined points of time. The inert fluid flow regulating device 33 can be configured as a controlled switch valve connected to an associated control module (not shown).

It is emphasized that the appliances 21, 23 and the appliances 31, 311, and the inert fluid flow regulating device 33 are configured to mediate delivery of reactive fluid and delivery of inert fluid, accordingly, into the reaction chamber independently, in a highly coordinated manner. Therefore, a number of functional modules can be established, in which the appliances that mediate fluid delivery function are arranged according to varying layouts, dependent on an embodiment. For clarity purposes, graphical indication for some features and related embodiments are given only with reference to particular drawings (1B, 3A-3D). It is assumed that the skilled reader shall be able to perceive the above-mentioned configurations also for FIGS. 1A, 2, 4A, 4B and 7, based on the teachings of FIGS. 1B, 3A-3D and related description.

The enclosed section or space 31 allows for connecting a number of reactors 100 to a common source of inert fluid 11 (not shown). In such configurations, centralized regulation of inert fluid supply via a device or the inert fluid flow regulating devices 33 can be realized.

The reactor 100 (FIGS. 1, 2, 4, 7) is preferably configured as an ALD device. Further configurations advantageously include photo-assisted ALD device(s) and Plasma Enhanced Atomic Layer Deposition (PEALD) device(s). The reactor 100 can still be adjusted for other chemical deposition processes, such as MLD, CVD and modifications thereof.

Figure 5B:
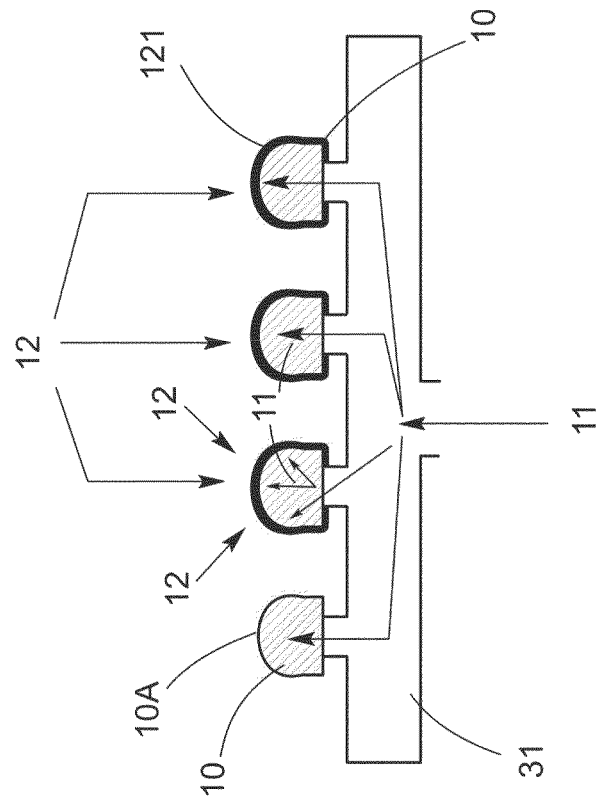
FIGS. 5A and 5B schematically illustrate a concept underlying the method of operation of the reactor assembly, according to the embodiments.
Figure 5A:
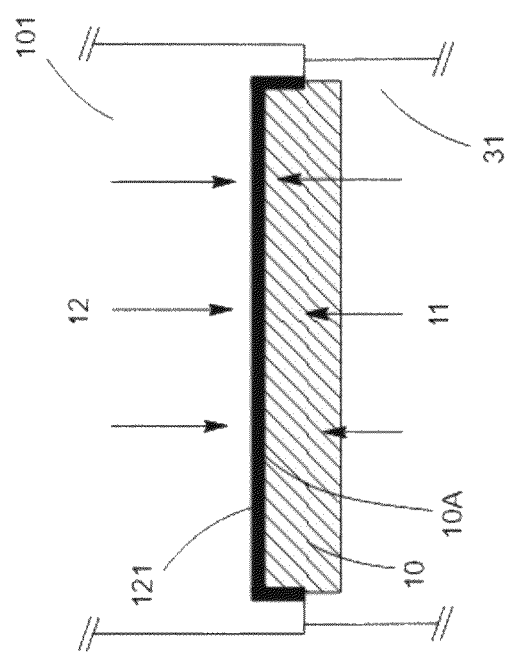

A concept that underlies the method of operation of the reactor assembly 100 disclosed hereinabove is illustrated by FIGS. 5A and 5B.

FIG. 5A illustrates formation of a coating 121 on the target surface 10A of the individual porous substrate made of essentially solid, fluid-permeable material 10 in the reactor 100 implemented according to any one of the embodiments depicted on FIGS. 1-3 and 4A, wherein the coating 121 is established along the entire target surface 10A of said substrate.

FIG. 5B illustrates formation of the coating 121 on a plurality of individual fluid-permeable substrates 10 having target surfaces 10A (see a leftmost substrate that is depicted uncoated). The cup-shaped substrates 10 sit on the open-end protrusions arranged at the enclosed section 31 configured as the substrate holder.

Reactive fluid 12 is directed into the reaction chamber accommodating, at least partly, the substrate 10. The substrate (target) surface 10A on which the coating shall be deposited is the surface of the substrate exposed to the flow of the reactive fluid 12.

In the method, the reactive fluid 12 delivered into the reaction chamber comprises a predetermined precursor compound.

Inert fluid 11 is directed, in turn, through the porous material (substrate) 10 towards the target surface 10A in such a way that at said surface the flow of inert fluid 11 encounters the flow of reactive fluid 12 thus preventing reactive fluid 12 from penetrating inside the porous substrate 10. The reactive fluid 12 is thus deposited exclusively onto the target surface 10A in the form of the coating 121.

In some instances, inert fluid 11 can be directed into the reaction space in a continuous, uninterrupted manner. Applied to a typical ALD deposition process, an interrupted flow of inert fluid 11 through the porous material 10, via the enclosed section 31, can be implemented throughout the entire ALD cycle. By continuously directing inert fluid 11 through the porous material towards the target surface 10A, penetration of reactive fluid 12, in particular, of precursor(s) contained in said reactive fluid, inside the porous material 10 is sustained or prevented. In such an event it is advantageous to thoroughly adjust the inert fluid flow speed to allow precursor molecules contacting the target surface 10A. The coating 121 is thus formed at an utmost surface layer of the substrate 10. The procedure is advantageous when formation of a thin coating layer, 0.1-100 nm, for example, is desired.

In some instances, it is preferred that precursor contained in reactive fluid 12 is allowed to flow into the porous substrate to a predetermined depth (depth resolution). The depth to which reactive fluid 12 penetrates into the porous material 10 can be regulated by altering the flow of inert fluid 11 at predetermined points of time by means of the inert fluid flow regulating device 33 (FIGS. 1-4).

Applied to an exemplary ALD deposition process, in some preferred configurations the inert fluid flow regulating device 33 can be set-up to alter (e.g. discontinue) the flow of inert fluid 11 at an exemplary time point 1, at which the precursor 12-X, as carried in the reactive fluid 12, shall allegedly reach the target surface 10A. In such an event the inert fluid flow regulating device 33 and/or the associated control module (not shown) registers a time point 0, at which precursor is injected into carrier fluid 11A via the valve 23 (FIGS. 1, 2, 4), and initiates the time point 1 upon expiration of a predetermined time period 0-1 during which said precursor, as carried in the reactive fluid 12, shall allegedly pass the feedline 21 and the reaction chamber 101 to arrive at the target surface 10A. Duration of the time period 0-1 is calculated such, as to allow the precursor to contact the target surface. The flow of inert fluid 11 through the substrate material 10 is resumed at a time point 2, wherein duration of a time period 1-2 is determined based on a required/desired measure of precursor penetration depth into the porous substrate 10.

In practice, duration of each time period 0-1, 1-2 may vary within a range of 0.001 s-100 s. In some configurations, duration of each said time period constitutes 0.1 s.

Mentioned time periods are a subject of adjustment dependent on the reactor design, substrate material, precursor chemicals, fluid flow velocity, required/desired depth resolution and other parameters.

The abovementioned action (interruption of inert fluid flow at the time point 1) can be further associated with actuating an inert fluid reverse flow. In such an event, at the time point 1, at which precursor allegedly reaches the target surface 10A, the flow of inert fluid 11 is discontinued and reversed, whereby reactive fluid 12 is forced to absorb into the porous material 10. Reverse flow of inert fluid (away from the target surface 10A) is maintained during the predetermined period 1-2. At the time point 2, the flow of inert fluid 11 is restored back into a direction towards to target surface 10A.

In some alternative configurations, the inert fluid flow regulating device 33 can be set-up to pause the flow of inert fluid at the time point 0, in accordance to what is disclosed hereinabove, and to resume the flow of said inert fluid 11 at an exemplary time point 1, at which said precursor, as carried in the reactive fluid 12, shall allegedly reach the target surface 10A. Duration of the period 0-1 is calculated such, as to allow precursor molecules contacting the target surface 10A.

It is preferred that control over operational functions of the inert fluid flow regulating devices 33 and the injection regulating device 23 (regulating the flow of inert fluid 11 and regulating injection of precursor (s) 12-X into the inert carrier 11A, respectively; FIGS. 1, 3, 4) is realized in an independent, highly coordinated manner. Thus, it is preferred that the reactor 100 further comprises a central control module (not shown) provided as an integrated or a standalone CPU solution with a user interface, and associated software. Software management functions preferably include implementing local and/or remote control (s), monitoring a number of reactor assemblies at a time, emergency power control (s) and the like.

In the embodiments, the coating 121 is a thin film, layer or sheet established on the target surface 10A in a single ALD cycle.

Figure 6:
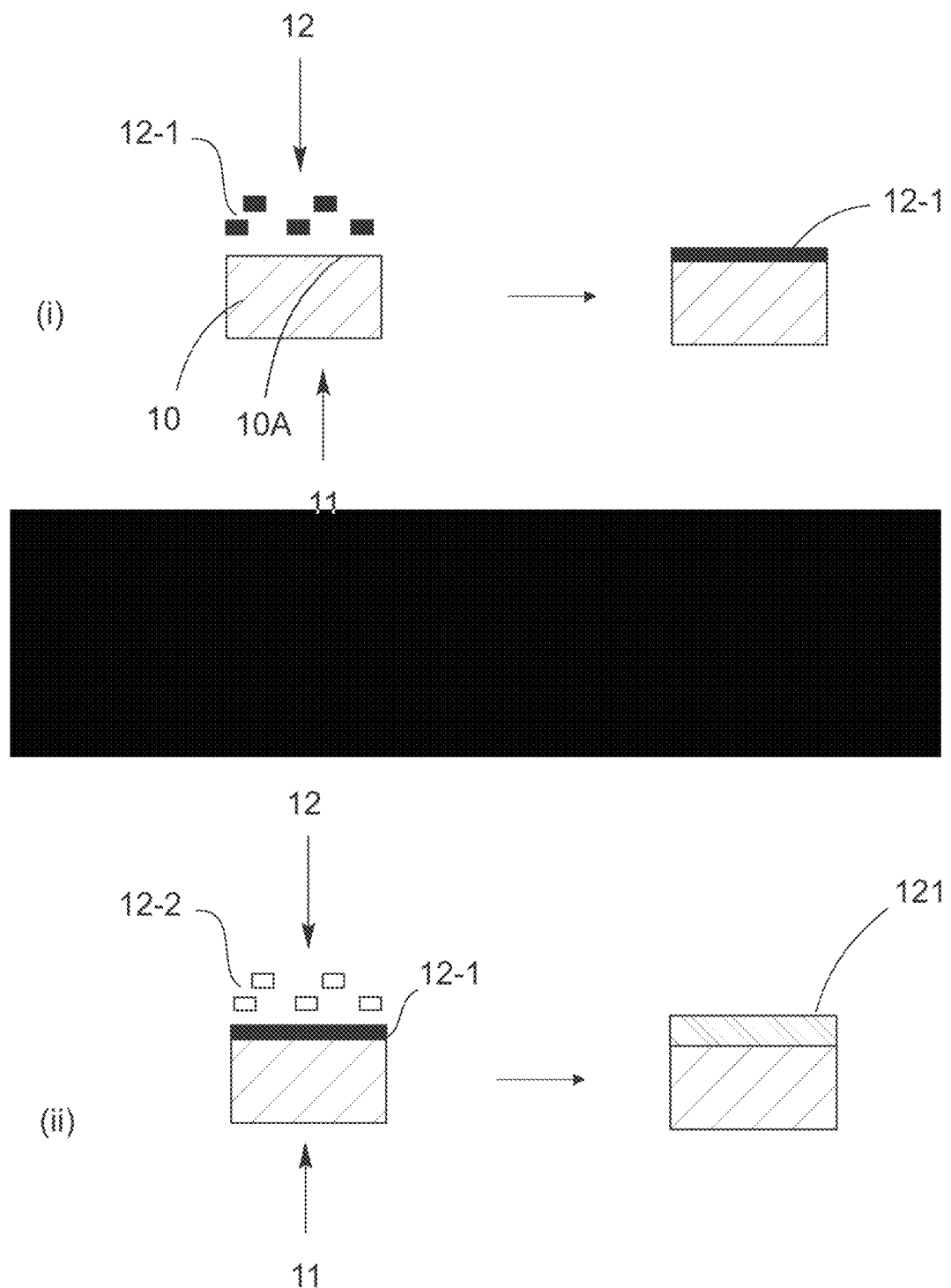
FIG. 6 schematically illustrates a coating method, according to the embodiments.

A reference is made to FIG. 6 being illustrative of the coating method according to some embodiments. The method depicted on FIG. 6 exploits the principles of atomic layer deposition and provides for sequential, temporally separated delivery of at least two different precursors 12-1, 12-2 into the reaction space. Precursors 12-1, 12-2 are preferably distinct chemicals selected such, as to form a preselected compound or composition 121 (hereby, the coating) on a surface of a porous substrate. Deposition half-reactions are indicated by Roman numerals (i) and (ii).

Inert fluid 11 is directed into the reaction chamber in a controlled manner, whereby the flow of inert fluid is adjustable by the inert fluid flow regulating device 33 in a manner described hereinabove.

In the method, reactive fluid 12 comprising a first predetermined precursor 12-1 is delivered (step i; left side) into the reaction chamber and a precursor sublayer is deposited at the target surface 10A by adjusting counter-flow of inert fluid 11 towards said target surface through the porous substrate in such a manner, that precursor molecules 12-1 are allowed to contact said surface 10A. The first precursor 12-1 enters a chemical reaction or reactions, typically by chemisorption, with the substrate 10 resulting on formation of the sublayer (step i; right side). Thereafter, the reaction chamber is purged with the inert carrier 11A, thereupon excess precursors and reaction products are evacuated with the exhaust flow (13, FIGS. 1, 2, 4). During purge, inert carrier fluid 11A (containing no precursor) is directed into the reaction chamber via the valve 23 (FIGS. 1, 2, 4). The purge step can be accompanied by directing the flow of inert fluid 11, through the porous substrate and the sublayer 12-1, in direction of the reaction chamber.

The method continues at ii (FIG. 6), whereupon the reactive fluid 12 comprising a second predetermined precursor 12-2 is delivered into the reaction chamber. The second precursor 12-2 undergoes a chemical reaction or reactions with the first precursor 12-1 provided as a related sublayer (step ii; left side). Counter-flow of inert fluid 11 towards the target surface 10A and the reaction space is adjusted such, as to allow precursor molecules 12-2 contacting the sublayer formed at step i.

During deposition of the second precursor 12-2, the precursor compounds 12-1 and 12-2 react with one another to form the compound 121, distinct from any one of 12-1 and 12-2 (ii, right).

Step ii is followed by purging the reaction chamber with the inert carrier 11A, as mentioned with regard to step i. Said purge step can be accompanied by directing the flow of inert fluid 11, through the porous substrate and the established coating layer 121, in direction of the reaction chamber.

Inert fluid 11 propagating into the reaction chamber 101 through the porous material 10 and inert fluid 11A used as a carrier for precursor(s) 12-X, 12-1, 12-2 are preferably same media, e.g. gaseous nitrogen ($N_2$) or argon. In some instances, use of different non-reactive media 11, 11A is not excluded.

In the embodiment, the flow of inert fluid 11 through the substrate 10 can be adjusted in such a way that at least one purge step can be implemented by using solely inert fluid 11 (i.e. in an absence of (inert) carrier fluid 11A). Thus, during purging, the flow of inert fluid 11 (through the substrate 10) into the reaction space can replace the flow of carrier fluid 11A via the feedline 21. Replacing the "purge flow" 11A by the flow of inert fluid 11 can be realized after at least one half-reaction within the ALD cycle.

Once the coating(s) 121 is established, a number of additional ALD cycles can be run n times, optionally in an absence of the inert counter-flow 11 via the porous substrate 10, to establish a number of additional coating layers 121n on the target surface, whereby multilayer (stack) structures can be produced.

Fluidic flow through the fluid-permeable material 10 can be controlled by pressure difference generated across said material 10 by the evacuation pump 104 and a number of regulating devices, such as 25, 33 (inert fluid flow regulating device), for example. The latter can be configured as switch valves equipped with mass-flow controller (s) and/or gas flow meter (s). Other control means include conventional appliances, such as gas- and pressure sensors. The reactor assembly 100 advantageously comprises an (automated) control system, implemented as a computer unit, for example, and comprising at least one processor and a memory with an appropriate computer program or software.

A number of non-limiting examples based on ALD techniques are presented hereinbelow.

Example 1

Formation of aluminum oxide ($Al_2O_3$) coating 121 on porous substrates, such as graphene, silicon oxide etc., from trimethylaluminum (TMA, $Al(CH_3)_3$) used as precursor 12-1 and water used as precursor 12-2.

Example 2

Deposition of a platinum (Pt) coating 121 on porous substrates, such as silicon substrates, for example, from platinum (II) acetylacetonate ($Pt(acac)_2$; precursor 12-1) and ozone ($O_3$; precursor 12-2).

Example 3

Deposition of an aluminum nitride (AlN) coating 121 on porous substrates, such as silicon substrates, for example, using aluminum chloride ($AlCl_3$) or TMA as precursor 12-1 and ammonia ($NH_3$) as precursor 12-2.

Example 4

Deposition of a chromium (IV) oxide coating 121 having thickness of 0.3-0.4 nm on porous substrates, such as ceramic substrates, for example, using chromyl chloride ($CrO_2Cl_2$) vapor as precursor 12-1 and water or hydrogen peroxide $H_2O_2$ as precursor 12-1.

Example 5

Deposition of a titanium oxide coating 121 having thickness of about 0.1 nm on porous substrates, such as ceramic substrates, for example, using titanium tetrachloride ($TiCl_4$) vapor as precursor 12-1 and water as precursor 12-1.

Example 6

Deposition of a silicon oxide coating 121 having thickness of about 0.1 nm on porous substrates, such as ceramic substrates, for example, using $H_2Si[N(C_2H_5)_2]_2$ (commercially supplied by Air Liquide under the product name SAM.24) vapor as precursor 12-1 and ozone ($O_3$) as precursor 12-1.

Each of the exemplary reactions described above usually produce a 0.03-0.4 nm thick layer per deposition cycle (depending on the deposition conditions), with typical (precursor) pulse duration being 0.1-1 s per chemical, each pulse being alternated with an about 10 s purge. Each pulse results in deposition of a sublayer; whereas the coating layer 121 is deposited in a deposition cycle comprising a number of pulse-purge sequences. In order to deposit a layer with thickness 10-100 nm, the deposition procedure may be completed within a time range of about 10 minutes to about 20 hours, depending on a number of cycles required and duration of each cycle. In similar manner, the coating 121 can be established from three or more precursors.

The method described above is particularly advantageous for manufacturing solid-state catalysts on porous supports. In such an event, the coating 121 is provided as a catalytic compound established in the course of sequential reactions i, ii, in accordance to what is described hereinabove. The layer 121 established by catalytic compounds is thus supported on the surface 10A of the porous material 10.

A variety of solid-state catalysts comprising catalytic coatings supported on the surfaces of porous materials can be provided for assisting the processes including, but not limited to conversion, addition and condensation. In particular, solid-state catalysts for polymerization of alkenes (olefins) with carbon number 2-12 can be provided. In particular, solid-state catalysts for polymerization of lower olefins (C2-C4), such as ethylene and propylene, for example, can be provided. Non-limiting examples include catalysts based on platinum-group metals, such as platinum, palladium and ruthenium, for example, and/or modified Phillips-type catalysts.

In some instances, the coating 121 can be established from a single precursor compound. The procedure advantageously exploits the principles of photo-assisted atomic layer deposition (hereby, photo-ALD), wherein surface film deposition reactions are triggered by photons delivered onto the target surface 10A via exposing the latter to electromagnetic radiation of at least one wavelength within a predetermined wavelength range. Ultraviolet radiation (100-400 nm), visible light (400-800 nm), or infrared radiation (over 800 nm) can be utilized. In described configuration, the reactor 100 may further comprise at least one radiation source 32 (shown on FIGS. 4A, 4B; electromagnetic energy is indicated by E), configured to emit radiation of at least one wavelength within the predetermined wavelength range. Additionally or alternatively, the radiation source 32 can be provided outside the reaction chamber (not shown). In such an event, the reactor assembly further comprises an appliance or appliances to deliver electromagnetic energy (E), such as electromagnetic radiation, to the target surface 10A and to the subsequently formed film 121. Such appliance(s) may be a window (e.g. in the lid), or an antenna device, for example. Due to high temperatures, such as 300° C. in case of ruthenium (Ru) deposition, for example, in the reaction chamber, external disposition of the radiation source, with regard to the reaction chamber, is preferred. It is should be appreciated that configurations depicted on FIGS. 1-3 and 7 can include the electromagnetic source or sources 32, as discussed hereinabove.

FIG. 7 shows an exemplary embodiment of the reactor assembly 100, rendered for formation of coatings on the fluid-permeable substrate 10 configured as the particulate substrate, such as powder- and/or fibrous substrate, for example.

The reactor comprises the enclosed section 31 configured to receive, at least partly, said particulate substrate 10. In configuration shown on FIG. 7 the enclosed section 31 is configured as an essentially tubular member loadable with said substrate. The enclosed section is preferably configured to pass through the reaction chamber 101 (the reaction space). In the reaction space 101, the substrate 10 is exposed to the flow of reactive fluid 12 within a predetermined area defined as at least one aperture 31A within the enclosed section 31. The target surface or surfaces 10A is/are established by these exposed area(s). The at least one aperture 31A can be an opening, optionally covered by a support material, such as a mesh, a net or a porous filter or a membrane, for example, in order to prevent the particulate substrate 10 from escaping the enclosed section 31.

Similar to what is disclosed on FIG. 3A, the enclosed section can be established by the fluid intake line configured to convey inert fluid 11 towards the target surface 10A. In the embodiment of FIG. 7, intake of inert fluid is accompanied by conveying particulate matter 10 via the enclosed space by a conveyor device 34.

The reactor assembly further comprises a first auxiliary enclosed section 31-1 and a second auxiliary enclosed section 31-2, each said section comprising loading- or unloading devices, respectively. The sections 31-1, 31-2 are disposed at both sides of the enclosed space 31.

An exemplary loading device 35, configured as a conventional silo, for example, can be provided in the first auxiliary enclosed section 31-1. Particulate matter 10 loaded into the reactor assembly 100 via the loading device 35 is conveyed, via the tubular enclosed space 31, into the reaction chamber 101, by means of the conveyor device 34. Said conveyor device can be extended throughout the entire length of the enclosed space 31 or, alternatively, the conveyor device can be provided within the auxiliary section 31-1.

Intake of inert fluid 11 into the enclosed section 31, via the first auxiliary section 31-1, is preferably implemented via a separate arrangement (not shown). Said inert fluid intake arrangement can be further configured to enable reverse flow (dashed arrow, enclosure 31-1).

An exemplary unloading device 36, configured as a container to collect coated particulate material 10, can be provided in the second auxiliary enclosed section 31-2. In similar manner as described for the 31-1, intake of inert fluid 11 into the enclosed section 31, via the second auxiliary section 31-2, is implemented via the separate arrangement (not shown); said arrangement further configured to enable reverse flow (dashed arrow, enclosure 31-2). Flow of inert fluid 11 entering the tubular enclosure 31 from both auxiliary enclosures 31-1 and 31-2 can be synchronized, in terms of at least flow velocity, time and fluidic pressure. By such an arrangement propagation of reactive fluid 12 inside the tubular enclosure 31 can be controlled.

The conveyor device 34 can be configured as a conveyor belt, a compression conveyor with a piston, a screw conveyor, or as a conveyor equipped with vibration means. The conveyor device can be optionally inclined to make use of the gravity flow.

The auxiliary enclosed sections 31-1, 31-2 are preferably configured to have adjustable volume. In addition to the inert fluid flow regulating device 33 described hereinabove, a number of auxiliary control devices can be provided within the sections 31-1, 31-2, including, but not limited with mass-flow meters and/or pressure sensors. Altogether, mentioned regulating appliances provide high-precision control over the flow of particulate matter 10 and over the flow of inert fluid 11 through the enclosed space 31 towards either or both auxiliary enclosures 31-1, 31-2, by actuating time-controlled reverse flow, for example.

As a result, the coating layer 121 deposited onto the target surface 10A of the particulate substrate 10 can be extended to any desired depth resolution across the particulate volume passing the aperture 31A.

Fluid flow through the particulate substrate 10 (FIG. 7) can be further enhanced by means of a vibration appliance or appliances that generate vibrational (e.g. shaking) movement and transfer that movement onto the substrate 10. Vibration appliances can be configured as mechanical vibrations sources, ultrasound generating sources, sources configured to induce vibration via wireless induction, and the like. The inventor has described relevant vibrational means in the International Application Publication WO 2018/050954.

The reactor further comprises containers 36 for collecting particulate material and conveying particulate material out from the reaction space.

The reactor 100 and the associated deposition method, as disclosed hereinabove, advantageously provide for manufacturing coated items made of essentially fluid-permeable material and having at least one surface 10A on which the coating layer 121 is formed. The reactor 100 allows for manufacturing a single coated item at a time or for manufacturing a batch of coated items at a time, wherein the batch comprises at least two substrates to be coated.

Coated items can be provided, in which the porous material 10 is porous metal, porous ceramics or porous polymers. In some instances, the porous material provided in the coated item(s) can be established by particulate substrates, such as powder substrates or fibrous substrates. Additionally, porous composites and semiconductor materials (e.g. silicon) can be coated.

It shall be appreciated by those skilled in the art that the embodiments set forth in the present disclosure may be adapted and combined as desired. The disclosure is thus intended to encompass any possible modifications of the device and the deposition method, recognizable by those of ordinary skill in the art, within a scope of appended claims.

The invention claimed is:

1. A reactor assembly configured for formation of coatings on surfaces of fluid-permeable substrates by chemical deposition, the reactor assembly comprising:
a reaction chamber configured to receive, at least in part, a fluid-permeable substrate having a first, target surface to be coated and a second, non-targeted surface, the reaction chamber being configured to receive the first, target surface therein, the reaction chamber comprising an outer sidewall having an aperture configured to accommodate the fluid-permeable substrate, the outer sidewall being larger than the aperture;
a circumference-adjusting system disposed at the outer sidewall of the reaction chamber, the circumference-adjusting system being configured to adjust the size of the aperture of the outer sidewall to retain the fluid-permeable substrate;
at least one reactive fluid intake line configured to mediate a flow of a reactive fluid into the reaction chamber;
an inert fluid delivery arrangement with at least one enclosed section outside of the reaction chamber, the at least one enclosed section adjoining the reaction chamber via the outer sidewall of the reaction chamber, the at least one enclosed section defining a cavity configured to receive, at least in part, the fluid-permeable substrate with the second, non-targeted surface disposed within the cavity of the at least one enclosed section when the fluid-permeable substrate is disposed in the reactor assembly with the first, target surface disposed within the reaction chamber and the second, non-targeted surface within the at least one enclosed section, the at least one enclosed section being configured to mediate a flow of inert fluid exposed to the second, non-targeted surface, passing through the fluid-permeable substrate to the first, target surface such that the flow of inert fluid first encounters the flow of the reactive fluid at the first, target surface;
at least one first switch valve configured to alter the flow of inert fluid at predetermined points of time to discontinue the flow of inert fluid at a time point when the reactive fluid reaches the first, target surface of said substrate, whereby a depth of penetration of reactive fluid into the fluid-permeable substrate at the first, target surface is regulated and a coating is formed, to a predetermined depth resolution, at the entire first, target surface of said substrate,
wherein the inert fluid delivery arrangement is configured such that the flow of inert fluid is directed from the at least one enclosed section, passing through the fluid-permeable substrate to the first, target surface of the fluid-permeable substrate toward the reaction chamber such that the flow of inert fluid first encounters the flow of the reactive fluid at the first, target surface when the coating is formed on the first, target surface of the fluid-permeable substrate,
wherein fluid flow between the enclosed section and the reaction chamber occurs solely via the fluid-permeable substrate.

2. The reactor assembly of claim 1, wherein the at least one enclosed section is disposed separate from the reaction chamber.

3. The reactor assembly of claim 1, wherein the inert fluid delivery arrangement further comprises at least one inert fluid intake line.

4. The reactor assembly of claim 3, further comprising at least one heating element adjoining or integrated into one or more of (i) the at least one enclosed section, and (ii) the at least one inert fluid intake line.

5. The reactor assembly of claim 3, further comprising at least one second switch valve configured to control the flow of reactive fluid in the at least one reactive fluid intake line.

6. The reactor assembly of claim 1, wherein the at least one enclosed section is provided essentially outside the reaction chamber.

7. The reactor assembly of claim 1, wherein the at least one enclosed section is provided in a lid.

8. The reactor assembly of claim 1, wherein the reactor assembly is configured as an atomic layer deposition (ALD) reactor.

9. Use of the reactor assembly according to claim 1 to coat gas sensors.

10. Use of the reactor assembly according to claim 1 to manufacture solid-state porous catalysts.

11. The reactor assembly of claim 1, wherein the reactor assembly is configured to receive the fluid-permeable substrate between the reaction chamber and the at least one enclosed section such that the at least one enclosed section is isolated from the reaction chamber and the flow of inert fluid between the at least one enclosed section and the reaction chamber occurs solely via the fluid-permeable substrate.

12. A reactor assembly system configured for formation of coatings on surfaces of fluid-permeable substrates by chemical deposition, the reactor assembly system comprising:
   a fluid-permeable substrate including a first, target surface to be coated and a second, non-targeted surface; and
   a reactor assembly comprising
      a reaction chamber configured to receive the first, target surface of the fluid-permeable substrate therein, the reaction chamber comprising an outer sidewall having an aperture configured to accommodate the fluid-permeable substrate, the sidewall being larger than the aperture,
      a circumference-adjusting system disposed at the outer sidewall of the reaction chamber, the circumference-adjusting system being configured to adjust the size of the aperture of the outer sidewall to retain the fluid-permeable substrate,
      at least one reactive fluid intake line configured to mediate a flow of a reactive fluid into the reaction chamber,
      an inert fluid delivery arrangement with at least one enclosed section outside of the reaction chamber, the at least one enclosed section adjoining the reaction chamber via the outer sidewall of the reaction chamber, the at least one enclosed section defining a cavity, the fluid-permeable substrate being at least partially received in the cavity of the at least one enclosed section with the second, non-targeted surface disposed within the at least one enclosed section, the at least one enclosed section being configured to mediate a flow of inert fluid exposed to the second, non-targeted surface, passing through the fluid-permeable substrate to the first, target surface such that the flow of inert fluid first encounters the flow of the reactive fluid at the first, target surface,
      at least one first switch valve configured to alter the flow of inert fluid at predetermined points of time to discontinue the flow of inert fluid at a time point when the reactive fluid reaches the first, target surface of said substrate, whereby a depth of penetration of reactive fluid into the fluid-permeable substrate at the first, target surface is regulated and a coating is formed, to a predetermined depth resolution, at the entire first, target surface of said substrate,
   wherein the inert fluid delivery arrangement is configured such that the flow of inert fluid is directed from the at least one enclosed section, passing through the fluid-permeable substrate to the first, target surface of the fluid-permeable substrate toward the reaction chamber such that the flow of inert fluid first encounters the flow of the reactive fluid at the first, target surface when the coating is formed on the first, target surface of the fluid-permeable substrate, and
   wherein fluid flow between the enclosed section and the reaction chamber occurs solely via the fluid-permeable substrate.

* * * * *